United States Patent [19]

Tedrow et al.

[11] Patent Number: 5,422,586
[45] Date of Patent: Jun. 6, 1995

[54] APPARATUS FOR A TWO PHASE BOOTSTRAP CHARGE PUMP

[75] Inventors: Kerry D. Tedrow, Orangevale; Jahanshir J. Javanifard, Sacramento; Cesar Galindo, Stockton, all of Calif.

[73] Assignee: Intel Corporation, Santa Clara, Calif.

[21] Appl. No.: 119,423

[22] Filed: Sep. 10, 1993

[51] Int. Cl.⁶ .......................... G11C 7/00; G11C 16/02
[52] U.S. Cl. ..................... 327/306; 327/261; 327/141; 327/100; 327/185
[58] Field of Search ............... 327/306, 261, 141, 100, 327/185; 365/226

[56] References Cited

U.S. PATENT DOCUMENTS 5,153,854 10/1992 Herold .
5,157,278 10/1992 Min et al. .
5,243,561 9/1993 Yamauchi .
5,245,572 9/1993 Kosonocky et al. .
5,276,646 1/1994 Kim .
5,313,429 5/1994 Chevallier et al. .

OTHER PUBLICATIONS

1992 IEEE International Solid-State Circuits Conference, ISSCC 92 Session 9/Non-Volatile and Dynamic Rams/Paper 9.3, "TP9.3: A 5V-Only 0.6 μm Flash EEPROM with Row Decoder Scheme in Triple-Well Structure", Masao Kuriyama, Shigeru Atsumi, Akira Umezawa, Hironori Banba, Ken-ichi Imamiya, Kiyomi Naruke, Seiji Yamada, Etsushi Obi, Masamitsu Oshikiri, Tomoko Suzuki, Sumio Tanaka, pp. 152, 153.

Primary Examiner—William L. Sikes
Assistant Examiner—Fetsum Abraham
Attorney, Agent, or Firm—Blakely, Sokoloff, Taylor & Zafman

[57] ABSTRACT

An integrated circuit charge pump circuit including a plurality of stages, each stage including a first N type field effect switching transistor device having source and drain terminals connected in series with the source and drain terminals of all other stages, a second N type field effect control transistor device having drain and source terminals connecting the drain terminal and the gate terminal of the first switching transistor device, and a storage capacitor joined to the source terminal of the first device; a source of voltage to be pumped is connected to the drain terminal of the first device of the first stage. A first series of clock pulses is applied to the gate terminals of the first switching transistor devices in every other stage of the charge pump and to the gate terminals of the second control transistor devices in stages between; and a second series of clock pulses which do not overlap the first series of clock pulses is applied to the gate terminals of the first switching transistor devices in alternate stages of the charge pump and to the gate terminals of the second control transistor devices in stages between the alternate stages. These pulses cause the switching transistor to switch on and off in alternate stages in a manner that the gate terminal goes higher than the drain terminal so that charge is transferred without threshold drop between stages and high current as well as high voltage is pumped to the output terminal.

9 Claims, 4 Drawing Sheets

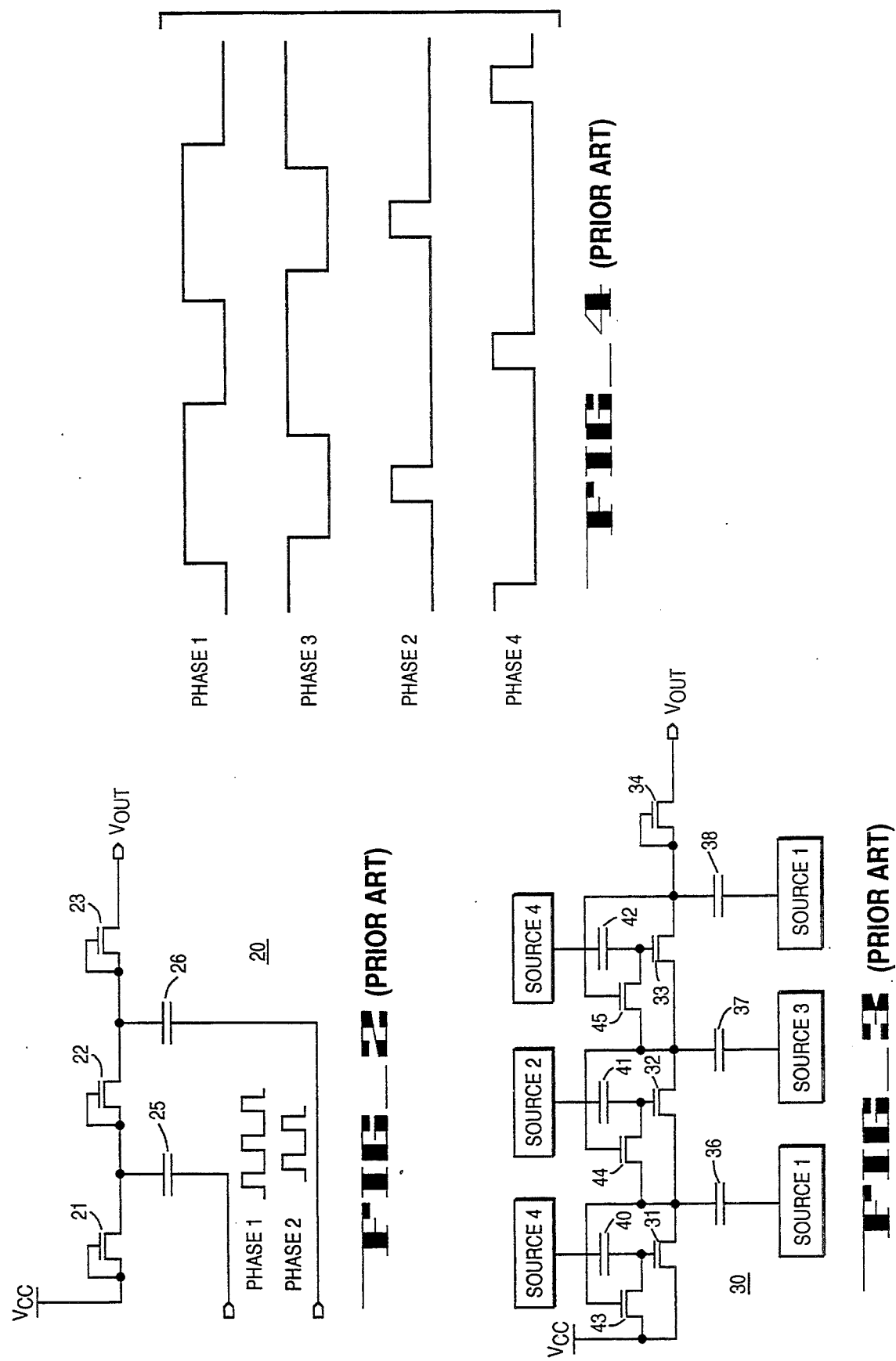

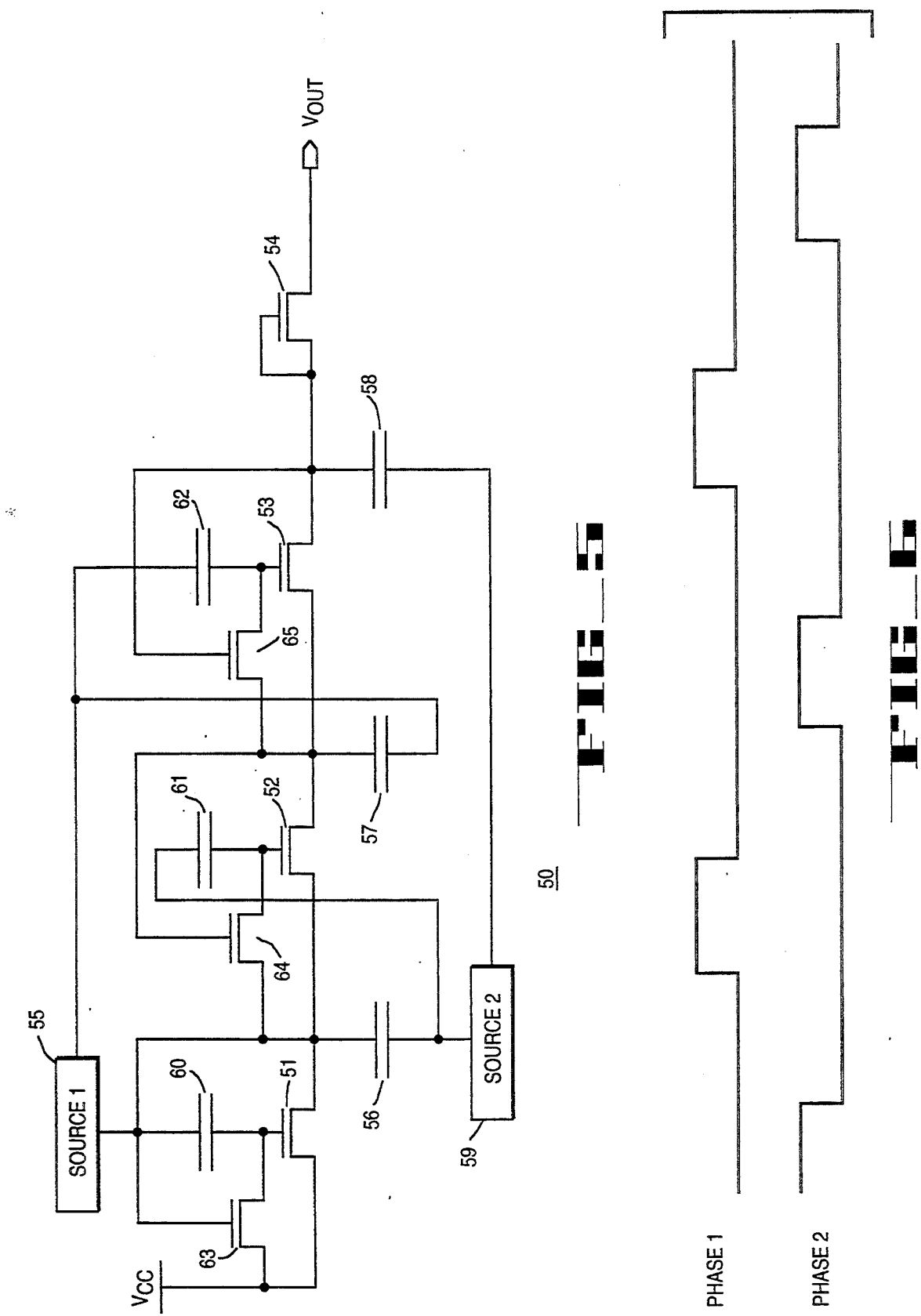

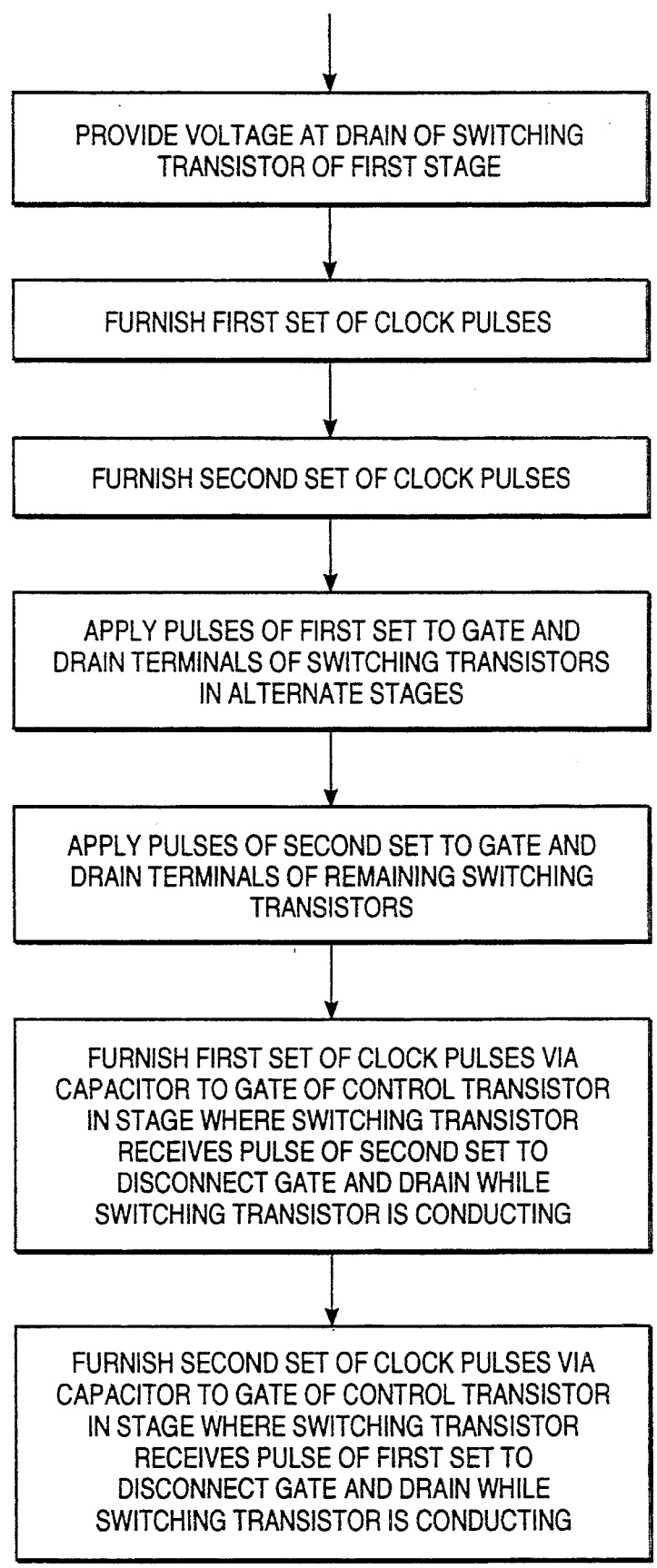
FIG_7

APPARATUS FOR A TWO PHASE BOOTSTRAP CHARGE PUMP

BACKGROUND OF THE INVENTION

1. Field Of The Invention

This invention relates to computer systems and, more particularly, to methods and apparatus for providing a charge pump for generating high voltages and high currents for erasing and programming flash electrically-erasable programmable read only memory arrays (flash EEPROMs).

2. History of the Prior Art

It has been found that the use of computers has grown so extensive that the power used by these computers has become significant. In order to reduce the cost of operation as well as the consequent use of energy resources, a substantial move is underway to reduce this power usage. A major trend in the manufacture of personal computers is toward the reduction in the voltage level required to operate the integrated circuits which are used in the various components of those computers. A simultaneous trend is the desire to provide portable computers which are able to provide most of the abilities of desktop computers but are assembled in very small and light packages. This has led to attempts to reduce the power used by portable computers so that their battery life will be extended.

In order to reduce power consumption and extend battery life, much of the integrated circuitry used in personal computers is being redesigned to run at low voltage levels. This reduces the power usage and allows more components to be placed closer to one another in the circuitry. The circuitry and components used in portable computers are being designed to operate at voltages levels such as 5 volts and 3.3 volts. This helps a great deal to reduce the power needs of personal computers.

However, at the same time, the desire to offer more features in portable computers opposes this salutary result. Many of the features require higher voltages to function. For example, one real convenience is the ability to change the basic input/output and startup (BIOS) processes as improvements in a computer or its peripherals occur. Historically, this has been accomplished by removing the electrically programmable read only memory (EPROM) or similar circuitry providing the read only memory for storing the BIOS processes and replacing it with new circuitry at additional cost. This is a complicated operation beyond the abilities of many computer users. Recently, flash electrically-erasable programmable read only memory (flash EEPROM memory) has been used to store BIOS processes. This memory may be reprogrammed without removing the BIOS circuitry from the computer by running a small update program when the BIOS processes are changed. However, reprogramming flash EEPROM memory requires approximately twelve volts to accomplish effectively; and the lower voltage batteries provided in personal computers are not capable of programming and erasing flash EEPROM memory.

Another form of flash EEPROM memory array provides another example of high voltage requirements in portable computers. Recently, a new form of long term random access storage has been devised using flash EEPROM memory arrays. An example of a flash EEPROM memory array which may be used in place of a hard disk drive is given in U.S. patent application Ser. No. 07/969,131, entitled *A Method and Circuitry For A Solid State Memory Disk*, S. Wells, filed Oct. 31, 1992, and assigned to the assignee of the present invention. These arrays provide a smaller lighter functional equivalent of a hard disk drive which operates more rapidly and is not as sensitive to physical damage. Such memory arrays are especially useful in portable computers where space is at a premium and weight is extremely important. However, these flash EEPROM memory arrays also require much higher voltages for writing and erasing data than can be provided directly by the batteries of portable computers. In situations in which batteries do not provide sufficient voltages, it has been typical to provide charge pumps to generate higher voltage from the lower voltages available. However, although such voltages pumps are able to increase the voltage to an appropriate level, prior art charge pumps do not provide sufficient current to generate the power for effectively erasing and programming flash EEPROM memory without the use of very large capacitors which utilize an inordinate amount of die space.

SUMMARY OF THE INVENTION

It is, therefore, an object of the present invention to provide integrated circuitry charge pumps capable of providing sufficient power to effectively erase and program flash EEPROM memory arrays.

It is another, more specific, object of the present invention to provide a highly efficient bootstrap charge pump circuit for generating the high voltages and currents necessary to program and erase flash EEPROM memory arrays.

These and other objects of the present invention are realized in an integrated circuit which includes an integrated circuit charge pump circuit. The charge pump circuit includes a plurality of stages, each stage including a first N type field effect transistor device having gate, source, and drain terminals, a second N type field effect transistor device controlling the voltage at the gate terminal of the first device. The circuit includes means for applying a first series of clock pulses to the gate of the first device in every odd numbered stage of the charge pump and to the gate of the second device in every even numbered stage, and means for applying a second series of clock pulses which do not overlap the first series of clock pulses to the gates of the first devices in every even numbered stage of the charge pump and to the gates of the second devices in every odd numbered stage which causes the gate of the first device of each stage to tie precharged so that the first device is switched on by a higher gate voltage than drain voltage to charge the next stage of the charge pump with essentially no threshold voltage drop.

These and other objects and features of the invention will be better understood by reference to the detailed description which follows taken together with the drawings in which like elements are referred to by like designations throughout the several views.

BRIEF DESCRIPTION OF THE DRAWINGS

FIG. 2 is a circuit diagram illustrating a first circuit functioning in accordance with the prior art.

FIG. 3 is a circuit diagram illustrating a four phase charge pump circuit.

FIG. 4 is a timing diagram useful in understanding the operation of the circuit of FIG. 3.

FIG. 5 is a circuit diagram illustrating a circuit functioning in accordance with the present invention.

FIG. 6 is a timing diagram useful in understanding the operation of the circuit of FIG. 5.

FIG. 7 is a flow chart describing a method in accordance with the present invention.

NOTATION AND NOMENCLATURE

Figure 1:
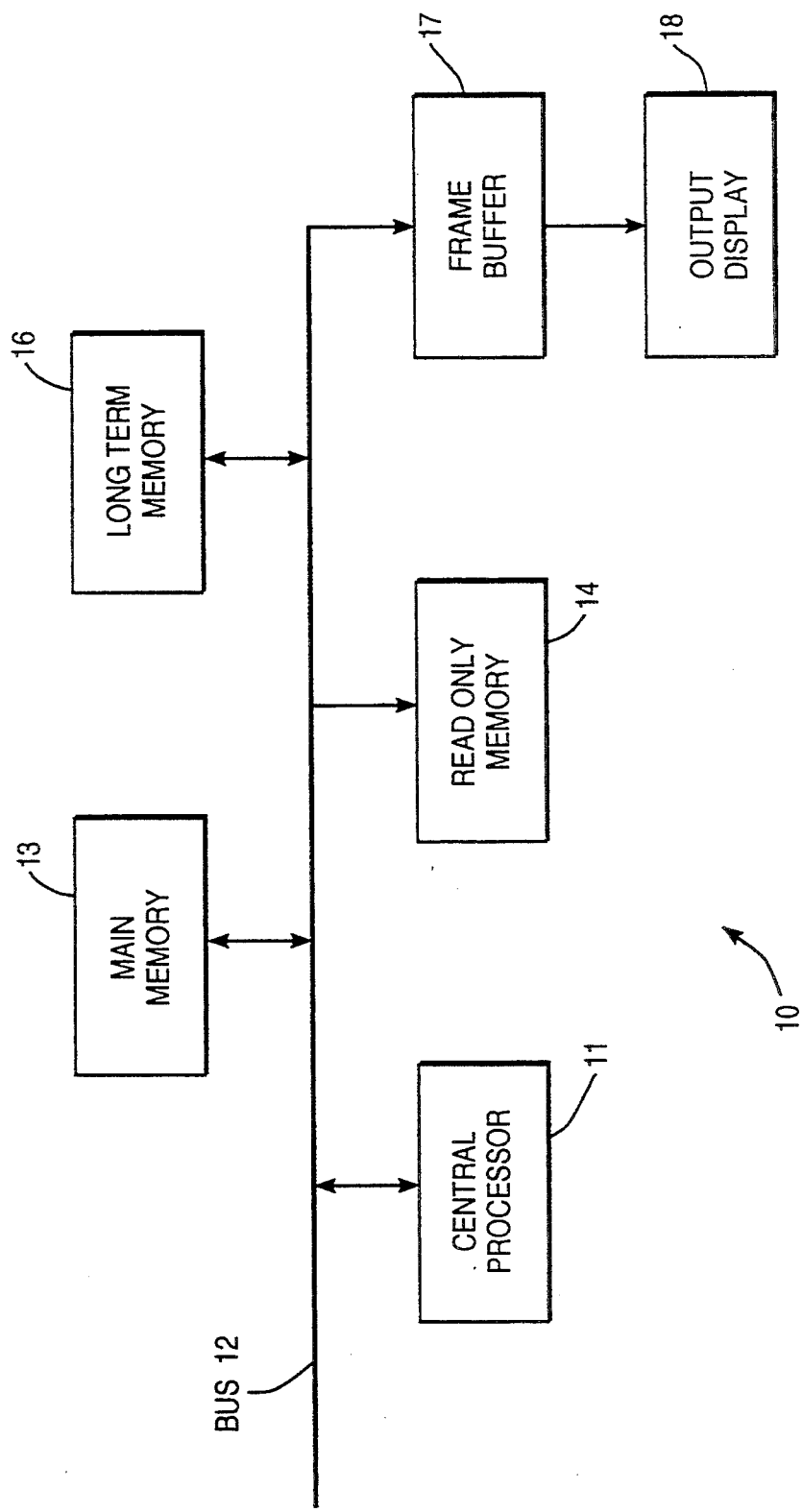
FIG. 1 is a block diagram illustrating a computer system including the present invention.

Some portions of the detailed descriptions which follow are presented in terms of symbolic representations of operations on data bits within a computer memory. These descriptions and representations are the means used by those skilled in the data processing arts to most effectively convey the substance of their work to others skilled in the art. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities.

Further, the manipulations performed are often referred to in terms, such as adding or comparing, which are commonly associated with mental operations performed by a human operator. No such capability of a human operator is necessary or desirable in most cases in any of the operations described herein which form part of the present invention; the operations are machine operations. Useful machines for performing the operations of the present invention include general purpose digital computers or other similar devices. In all cases the distinction between the method operations in operating a computer and the method of computation itself should be borne in mind. The present invention relates to a method and apparatus for operating a computer in processing electrical or other (e.g. mechanical, chemical) physical signals to generate other desired physical signals.

DETAILED DESCRIPTION

Referring now to FIG. 1, there is illustrated a computer system 10. The system 10 includes a central processor 11 which carries out the various instructions provided to the computer 10 for its operations. The central processor 11 is joined to a bus 12 adapted to carry information to various components of the system 10. Joined to the bus 12 is main memory 13 which is typically constructed of dynamic random access memory arranged in a manner well known to those skilled in the prior art to store information during a period in which power is provided to the system 10. Also joined to the bus 12 is read only memory 14 which may include various memory devices well known to those skilled in the art each of which is adapted to retain a particular memory condition in the absence of power to the system 10. The read only memory 14 typically stores various basic functions used by the processor 11 such as basic input/output processes and startup processes typically referred to as BIOS processes. Such memory 14 may be constructed of flash EEPROM memory cells adapted to be modified as various ones of the BIOS processes used by a particular computer are changed. Typically, such flash EEPROM memory will include circuitry for programming and erasing the memory array. If the memory 14 is constructed of flash EEPROM memory cells, it may be modified by running an update process on the computer system 10 itself to reprogram the values stored in the memory 14.

Also connected to the bus 12 are various peripheral components such as long term memory 16 and circuitry such as a frame buffer 17 to which data may be written which is to be transferred to an output device such as a monitor 18 for display. The construction and operation of long term memory 16 (typically electro-mechanical hard disk drives) is well known to those skilled in the art. However, rather than the typical electro-mechanical hard disk drive, a flash EEPROM memory array may be used as the long term memory 16. Such flash EEPROM memory arrays are programmed and erased through techniques which utilize voltages greater than that typically available to the integrated circuits of more advanced portable computers. Such flash EEPROM memory arrays typically include circuitry for programming and erasing the memory array. Consequently, such long term memory arrays as well as memory 14 may provide circuitry in accordance with this invention for generating high voltages from the lower voltages available from their batteries.

FIG. 2 illustrates a typical prior art charge pump circuit 20. The circuit 20 includes some number of N channel field effect transistors devices (21, 22, and 23 are shown) connected with their drain and source terminals in series between a source of potential Vcc and an output terminal indicated at Vout. Capacitors 25 and 26 are utilized to provide two non-overlapping clock signals (phase 1 and phase 2) from sources not shown in the figure which vary between a low value of ground and a high value of Vcc in the sequence illustrated. Following the timing diagram of FIG. 2, since the gate terminal of the N device 21 is connected to its drain, the gate terminal is substantially higher than the source terminal so the N device 21 is initially on, allowing the capacitor 25 to charge to the value Vcc less the threshold voltage drop Vt across the device 21. The device 22 is off at this time because both input phases are low. When the phase 1 clock goes high, the high voltage at the source of the device 21 transferred by the capacitor 25 causes the device 21 to turn off. This same voltage raises the voltage at the drain and gate terminals of the device 22 so that the device 22 turns on and begins charging the capacitor 26. When the phase 1 clock goes low again, the device 22 begins to cease conducting charge to the capacitor 26; and the device 21 turns back on and begins to charge the capacitor 25.

When the phase 2 clock pulse goes high, the device 23 comes on and furnishes charge to the output terminal Vout. This pattern of charging continues with the voltage at the output terminal Vout. The voltage at this terminal will ultimately approach a value which is just less than the number of stages of the charge pump plus one multiplied by the value of the source voltage Vcc minus the threshold drop of each stage $[(N+1) \times (Vcc - Vt)]$.

Typically, the output terminal Vout furnishes the charge to a circuit which may be represented as a capacitor and which does not draw any appreciable amount of current. It may be shown that the amount of current which is transferred by this conventional charge pump is directly related to the voltage at the output terminal Vout. The higher the voltage at the output terminal, the less current is transferred. Consequently, if the voltage at the output terminal is regulated and remains relatively high from pulse to pulse of the input clocks, once the circuit has been running for any time, then though the voltage at the output may be raised to a high value, the average current is relatively small.

If it is desired to erase or program flash EEPROM memory arrays, both high voltage and high current are required to be delivered by the charge pump. This is true because the flash EEPROM cells provide a resistive load when they are being erased. Consequently, a conventional charge pump cannot be used to provide erase or program currents to flash EEPROM memory arrays without requiring very large capacitors which occupy an inordinate amount of die space. One way in which a more efficient pump capable of furnishing a greater amount of current may be designed is to use a bootstrap type of pump. FIG. 3 illustrates a prior art first type of bootstrap pump arrangement. As is shown in FIG. 3, the pump 30 includes a number of stages of N type field effect transistors 31, 32, 33, and 34 connected in series between a source of voltage Vcc and an output terminal Vout. Phase 1 and 3 input clock signals are furnished to the circuit 30 from sources 1 and 3, respectively, via capacitors 36, 37, and 38. Phase 2 and 4 input clock signals are furnished from sources 2 and 4, respectively, by capacitors 40, 41, and 42. Each stage of the circuit 30 includes an N channel field effect transistor device 43, 44, or 45 used to control the voltage at the gate terminal of the device 31, 32, or 33 of that stage.

The four individual clock signals referred to as phase 1, phase 2, phase 3, and phase 4 are shown in FIG. 4. In order to understand the operation of the circuit 30, the operation of a single stage including the switching transistor 32 will be discussed. Following the prior art timing diagram of FIG. 4, the phase 3 and phase 4 clocks are initially high. Since the phase 3 clock is high, the control device 44 is initially on. When the phase 1 clock signal goes high, the voltage pulse applied through the capacitor 36 charges the capacitor 41 at the gate terminal of the device 32 through the device 44 to the voltage level of the drain terminal of the device 32. When the phase 3 clock then goes low, the device 44 turns off, isolating the gate of the device 32 and leaving the capacitor 41 charged. This also lowers the voltage at the source of the device 32 so that the device 32 begins to conduct. When the phase 2 clock then goes high, the voltage at the gate is appreciably higher than at the drain because of the precharging of the capacitor 41. This turns the device 32 on in the region in which it experiences no threshold voltage (Vt) drop. The elimination of the Vt drop means that the circuit can provide increased current from the capacitor 36 to the next stage. The high voltage at the capacitor 36 begins to charge the capacitor 37 and to the capacitor 42 through the device 45 very rapidly.

When the phase 2 clock then goes low, the device 32 begins to go off. When the phase 3 clock goes high, the device 44 turns on discharging the gate of the device 32 and bringing it toward the voltage of the drain so that the device 32 turns off rapidly. When the phase 1 clock then goes low, the device 32 stays off and the device 44 stays on so that the charge at the drain and gate are equalized.

Viewing the circuit as a whole, when the device 31 comes on in response to the high phase 4 clock, its gate has been charged through the device 43 which has gone off. Thus, the device 31 comes on without a Vt drop and charges the capacitor 36 and the capacitor 41 very rapidly. Then the device 31 begins to turn off as the phase 4 clock goes low. The rising phase 1 pulse completes the turnoff of the device 31 by discharging the capacitor 40 through the device 43. The high phase 1 clock continues the charging of the capacitor 41 until the drop of the phase 3 clock turns off the device 44 leaving the gate of the device 32 charged. As explained above, the lowering of the phase 3 clock begins turning on the device 32 which comes on completely without a Vt drop when the phase 2 clock goes high and the gate of the device 32 goes above the drain. This allows the rapid charge of the capacitors 37 and 42. The same sequence continues through whatever number of stages are present until the charge on the capacitor 38 is sufficient to turn on the device 34 to provide a pumped voltage level at the output of the circuit 30. It should be noted that the last stage operates in a range in which it exhibits a Vt drop.

This basic operation continues in the manner explained. The three stage pump circuit 30 illustrated in FIG. 3 furnishes approximately N (where N is the number of stages) plus one times the voltage of the source Vcc at the output terminal less the Vt drop of the device 34. For example, with Vcc equal to 4.4 volts, an output voltage of 17.1 volts is furnished at the output of the pump circuit 30. More importantly, the circuit 30 provides a more efficient operation than does the conventional pump illustrated in FIG. 2 because the circuit 30 does not have the threshold voltage drops of the circuit 20 except for the last stage. This allows it to provide more current at the output terminal. This efficiency is a result of the bootstrapping operation by which the capacitors 40, 41, and 42 are charged and then the charging path is cut off so that the charge cannot dissipate before the devices 31, 32, and 33 are turned on. The charged gate terminal forces a higher voltage on the gate terminal than the drain terminal of each switching transistor when that switching transistor is turned on causing the transistor to function without a threshold voltage drop. This increased efficiency allows the charge pump to use smaller capacitors and thus be implemented in a smaller die area on an integrated circuit.

As those skilled in the art will recognize, the four individual clock phases needed to operate the circuit 30 are very difficult to generate. The clocks are of different lengths and must be accurately overlapped in order to provide the appropriate operation of the circuit to obtain its advantageous results. In practice, it appears that such circuitry cannot be produced economically with real expectation of success. This is especially true when operating at frequencies which produce 50 ns. clock periods.

The circuit 50 illustrated in FIG. 5 may be produced economically and will provide essentially the same results as that produced by the circuit 30 of FIG. 3. The basic circuitry of FIG. 5 is similar to that utilized in FIG. 3. However, in contrast to the circuit 30 of FIG. 3, the circuit 50 includes only two sources of clock pulses. The clock pulses produced by these sources are shown in FIG. 6. These clock pulses are applied in a unique manner in order to allow the operation of the circuit 50 to produce the desired output voltages and currents. The flow chart of FIG. 7 describes this operation. The circuit 50 includes a number of stages of N type field effect transistors 51, 52, 53, and 54 connected in series between a source of voltage Vcc and an output terminal Vout. In the preferred embodiment of the circuit, the transistors 51, 52, and 53 as well as the other transistors are special N type devices referred to as S type devices. S type devices are basically N type devices having a very low threshold voltage level. The use and manufacture of S type devices are described in detail in U.S. Pat. Nos. 4,052,229; 4,096,584; 4,103,189; and 5,057,715. Two phases of input clock signals (phase 1 and phase 2) are furnished to the circuit 50 from sources 55 and 59 via capacitors 56, 57, and 58. The same two phases of input clock signals are furnished from sources 55 and 59 by capacitors 60, 61, and 62. Each stage of the circuit 50 includes an N channel field effect transistor device 63, 64, or 65 connected to the gate terminal of the device 51, 52, or 53 of that stage.

In contrast to the circuit 30 of FIG. 3, the two phase clock signals do not overlap and the capacitors 60, 61, and 62 are not precharged by the devices 63, 64, and 65. Referring the FIG. 6, it may be seen that the phase 2 clock is illustrated as high initially. When this clock is high, enabling signals are applied to the gate terminals of the control devices 63 and 65; and to the gate of switching device 52. These pulses turn the control devices 63 and 65 on. The high voltage from the source 2 is also applied at the drain of The device 52, and the high voltages at both the drain and gate of the device 52 cause it to turn on. When the device 52 goes on, its drain and gate are initially at the same value. However, since the phase 1 clock is low, the control device 64 joining the drain and gate of the device 52 is off. Thus, after the device 52 has been on for any period, the high voltage at the drain transfers charge from the capacitor 56 to the capacitor 57, reducing the voltage level at the drain of the device 52. This causes the voltage at the gate of the device 52 to be higher than either the drain or the source; and the device 52 switches completely on without any threshold voltage drop, increasing the current furnished to the next stage.

As the voltage at the drain and source of the device begin to equalize, the voltage at the gate of the control device is raised so that the control device is nearly on. When the phase 2 clock pulse goes low, the device 64 turns on. The lowering of the voltage at the gate of the device 52 when the phase 2 pulse goes low causes the device 52 to begin to turn off. Simultaneously, the gate terminals of each of the control devices 63 and 65 are lowered turning off the devices 63 and 65 so that the drain and gate terminals of the devices 51 and 53 are isolated from each other. When the phase 1 clock pulse goes high, the device 64 switches completely on and equalizes the gate and drain of the device 52. At the same time, the gate terminals of the devices 51 and 53 are raised by the value Vcc while the drain of the device 53 is raised by the value Vcc.

The devices 51 and 53 function similarly to the device 52 in transferring charge to the capacitors 56 and 58. The gate and drain terminals of these devices are initially equal, but then the drain voltage drops as charge is transferred to the capacitors 56 and 58 of the next stages so that the devices are switched completely on and experience no threshold voltage drop.

Thus, when the phase 1 clock goes high, the device 51 turns on; and current provided by the source Vcc charges the capacitor 56. When the phase 1 pulse goes low the device 51 switches off. Then the phase 2 clock pulse turns on the device 52; and the capacitor 56 provides stored charge and charge due to the phase 2 pulse to the capacitor 57. The device 52 switches off when the phase 2 pulse goes low. When the phase 1 pulse again goes high, the source Vcc again charges the capacitor 56. Simultaneously, the device 53 goes on and the capacitor 57 provides stored charge as well as the pulse from the phase 1 clock to charge a capacitor 58. When the phase 1 clock goes low, the device 53 turns off. When the phase 2 clock later goes high, the output device 54 turns on and furnishes a pumped voltage at Vout equal approximately to the number of stages plus one multiplied by the value of Vcc less the Vt drop of the output device 54.

Ultimately, the charging of the capacitor 58 and the positive swing of the phase 2 clock pulse raise the voltage level on the capacitor 58 sufficiently above the level Vout to cause the conduction of the switching device 54. This provides the desired output voltage while furnishing the high level of current necessary to erase and program flash EEPROM memory arrays.

Thus, as may be seen, the arrangement of FIG. 5 provides a reliable charge pump circuit capable of producing high levels of current efficiently with a substantial reduction in the circuitry and die space necessary in the prior art. The circuit of FIG. 5 also offers the advantage that it requires substantially less delay in various voltage regulation circuitry utilized with the circuit in its usual arrangement.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. An integrated circuit charge pump circuit comprising a plurality of stages, each stage including
    a first N type field effect switching transistor device having gate, source and drain terminals, each switching transistor device of each stage being connected in series with switching transistor devices of other stages,
    a second N type field effect control transistor device having gate, source and drain terminals, the drain and source terminals connecting the drain terminal and the gate terminal of the first switching transistor device, and
    a storage capacitor joined to the source terminal of the first switching transistor device;
    a voltage source providing voltage to be pumped and connected to the drain terminal of the first switching transistor device of the first stage;
    a first clock source providing a first series of clock pulses;
    circuitry connecting the first series of clock pulses to the gate terminals of the first switching transistor devices in odd stages of the charge pump and to the gate terminals of the second control transistor devices in even stages;
    a second clock source providing a second series of clock pulses which do not overlap the first series of clock pulses; and
    circuitry connecting the second series of clock pulses to the gate terminals of the first switching transistor devices which do not receive the first series of clock pulses and to the gate terminals of the second control transistor devices which do not receive the first series of clock pulses such that the first switching transistor devices are switched on to charge the next stage of the charge pump.

2. An integrated circuit charge pump circuit as claimed in claim 1 further comprising an output stage comprising a first N type field effect switching transistor device having gate, source and drain terminals, the drain terminal being connected in series with a last stage of the circuit, and the gate terminal being connected to the drain terminal.

3. An integrated circuit charge pump circuit as claimed in claim 2 in which each of the switching transistor devices and each of the control transistor devices is an S type field effect transistor device.

4. An integrated circuit charge pump circuit comprising a plurality of stages, each stage including
a switching transistor device having gate, source, and drain terminals, the source and drain terminals of each stage being connected in series with the source and drain terminals of all other stages,
means for connecting in series the switching transistor device, switching transistor devices in adjacent stages and
first storage means joined to the source terminal of the switching device;
second storage means joined to the gate terminal of the switching device;
means for providing a voltage to be pumped at the drain terminal of the first switching transistor device of a first stage of the charge pump circuit;
means for furnishing a first set of clock pulses;
means for furnishing a second set of clock pulses which do not overlap the first set of clock pulses;
means for applying pulses of the first series of clock pulses to the gate and drain terminals of the switching transistor devices in alternate stages of the charge pump circuit;
means for applying pulses of the second series of clock pulses to the gate and drain terminals of the switching transistor devices in stages of the charge pump circuit which switching transistor devices do not receive the first series of clock pulses at gate terminals;
means responsive to the first and second series of clock pulses for disabling the means for connecting the drain terminal and the gate terminal of the switching transistor device of each stage of the charge pump circuit during a period beginning with the turn on of the switching transistor of that stage and continuing until the storage means of that stage has charged to a voltage level equal to a voltage level at the drain of the switching transistor device of that stage, whereby the gate of the switching transistor of each stage is held at a voltage level during conduction sufficient to eliminate threshold voltage drop.

5. An integrated circuit charge pump circuit as claimed in claim 4 further comprising an output stage comprising a switching transistor device having gate, source and drain terminals, the output stage connected in series to a last stage of the plurality of stages, and gate terminal being connected to the drain terminal.

6. An integrated circuit charge pump circuit as claimed in claim 4 in which the means for connecting the the switching transistor device comprises a control transistor device having gate, source, and drain terminals, the source and drain terminals being connected in a path between the gate and drain terminals of the switching transistor device of that stage.

7. An integrated circuit charge pump circuit as claimed in claim 6 in which the means responsive to the first and second series of clock pulses for disabling the means for connecting the drain terminal and the gate terminal of the switching transistor device of each stage of the charge pump circuit during a period beginning with the turn on of the switching transistor of that stage and continuing until the storage means of that stage has charged to a voltage level equal to a voltage level at the drain of the switching transistor device of that stage, comprises:
means for furnishing the first set of clock pulses to the gate terminals of control transistor devices in stages in which the second set of clock pulses is applied to the gate of the switching transistor device, and
means for furnishing the second set of clock pulses to the gate terminals of control transistor devices in stages in which the first set of clock pulses is applied to the gate of the switching transistor device.

8. An integrated circuit charge pump circuit as claimed in claim 7 in which the first storage means joined to the source terminal of the switching device and the second storage means joined to the gate terminal of the switching device each comprises a capacitor,
in which the means for furnishing the first set of clock pulses to the gate terminals of control transistor devices in stages in which the second set of clock pulses is applied to the gate of the switching transistor device, comprises means furnishing the first set of clock pulses to the capacitor and means joining the capacitor to the gate terminal of the control transistor device of that stage; and
in which the means for furnishing the second set of clock pulses to the gate terminals of control transistor devices in stages in which the first set of clock pulses is applied to the gate of the switching transistor device comprises means furnishing the second set of clock pulses to the capacitor and means joining the capacitor to the gate terminal of the control transistor device of that stage.

9. An integrated circuit charge pump circuit as claimed in claim 8 in which each of the switching transistor devices and each of the control transistor devices is an S type field effect transistor device.

* * * * *

UNITED STATES PATENT AND TRADEMARK OFFICE
CERTIFICATE OF CORRECTION

| | | |
|---|---|---|
| PATENT NO. | : | 5,422,586 |
| DATED | : | June 6, 1995 |
| INVENTOR(S) | : | Tedrow et al. |

It is certified that error appears in the above-identified patent and that said Letters Patent is hereby corrected as shown below:

In column 2 at line 52 delete "tie" and insert --be--

In column 7 at line 28 delete "The" and insert --the--

In column 10 at line 5 insert --the-- following "and" and prior to "gate"

Signed and Sealed this

Fifth Day of November, 1996

Attest:

BRUCE LEHMAN

*Attesting Officer*     *Commissioner of Patents and Trademarks*